(12) United States Patent
Brunner et al.

(10) Patent No.: US 9,293,671 B2
(45) Date of Patent: Mar. 22, 2016

(54) OPTOELECTRONIC COMPONENT AND METHOD FOR PRODUCING AN OPTOELECTRONIC COMPONENT

(75) Inventors: Herbert Brunner, Sinzing (DE); Hans-Christoph Gallmeier, Regensburg (DE); Simon Jerebic, Tegernheim (DE); Stephan Preuβ, Bad Abbach (DE); Hansjörg Schöll, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/695,606

(22) PCT Filed: Apr. 11, 2011

(86) PCT No.: PCT/EP2011/055621
§ 371 (c)(1),
(2), (4) Date: Nov. 27, 2012

(87) PCT Pub. No.: WO2011/134777
PCT Pub. Date: Nov. 3, 2011

(65) Prior Publication Data
US 2013/0113010 A1   May 9, 2013

(30) Foreign Application Priority Data

Apr. 30, 2010 (DE) .......................... 10 2010 028 407

(51) Int. Cl.
*H01L 21/00* (2006.01)
*H01L 33/60* (2010.01)
(Continued)

(52) U.S. Cl.
CPC .............. *H01L 33/60* (2013.01); *H01L 33/005* (2013.01); *H01L 33/46* (2013.01); *H01L 33/56* (2013.01); *H01L 33/486* (2013.01); *H01L 33/508* (2013.01); *H01L 2924/0002* (2013.01)

(58) Field of Classification Search
CPC ................................ H01L 33/56; H01L 33/60
USPC ............................................... 257/88; 438/26
See application file for complete search history.

(56) References Cited

U.S. PATENT DOCUMENTS

2004/0201028 A1* 10/2004 Waitl et al. ...................... 257/99
2006/0022214 A1* 2/2006 Morgan et al. ................... 257/99
(Continued)

FOREIGN PATENT DOCUMENTS

DE  10 2004 053116   5/2006
JP         8 078450   3/1996
(Continued)

*Primary Examiner* — Ajay K Arora
(74) *Attorney, Agent, or Firm* — Cozen O'Connor

(57) ABSTRACT

An optoelectronic component comprising an optoelectronic semiconductor chip (104) having a contact side (106) and a radiation coupling-out side (108) situated opposite; a chip carrier (102), on which the semiconductor chip (104) is applied via its contact side (106); a radiation conversion element (110) applied on the radiation coupling-out side (108); and a reflective potting compound (112), which is applied on the chip carrier (102) and laterally encloses the semiconductor chip (104) and the radiation conversion element (110); wherein the potting compound (112) adjoins an upper edge of the radiation conversion element (110) in a substantially flush fashion, such that a top side of the radiation conversion element (110) is free of the potting compound (112).

17 Claims, 5 Drawing Sheets

(51) Int. Cl.
- *H01L 33/00* (2010.01)
- *H01L 33/46* (2010.01)
- *H01L 33/56* (2010.01)
- *H01L 33/48* (2010.01)
- *H01L 33/50* (2010.01)

(56) References Cited

U.S. PATENT DOCUMENTS

| | | | |
|---|---|---|---|
| 2006/0065906 A1* | 3/2006 | Harada | 257/98 |
| 2007/0166853 A1 | 7/2007 | Guenther et al. | |
| 2008/0213928 A1* | 9/2008 | Harada | 438/26 |
| 2009/0166657 A1 | 7/2009 | Yamada et al. | |
| 2010/0140648 A1 | 6/2010 | Harada et al. | |

FOREIGN PATENT DOCUMENTS

| | | |
|---|---|---|
| JP | 2001-223285 | 8/2001 |
| JP | 2002/050800 | 2/2002 |
| JP | 2004/165308 | 6/2004 |
| JP | 2008-047569 | 2/2008 |
| JP | 2008-277592 | 11/2008 |
| JP | 2008-306151 | 12/2008 |
| JP | 2009-182307 | 8/2009 |
| JP | 2009-218274 | 9/2009 |
| JP | 2010-140942 | 6/2010 |
| WO | WO 2006/048064 | 5/2006 |
| WO | WO 2006/118104 | 9/2006 |
| WO | WO 2009/069671 | 6/2009 |
| WO | WO 2010/035206 | 4/2010 |

* cited by examiner

OPTOELECTRONIC COMPONENT AND METHOD FOR PRODUCING AN OPTOELECTRONIC COMPONENT

RELATED APPLICATIONS

This is a U.S. National Phase Application under 35 USC 371 of International Application PCT/EP2011/055621 filed on Apr. 11, 2011.

This application claims the priority of German application no. 10 2010 028 407.6 filed Apr. 30, 2010, the entire content of which is hereby incorporated by reference.

FIELD OF THE INVENTION

The present invention relates to an optoelectronic component and a method for producing an optoelectronic component.

BACKGROUND OF THE INVENTION

In an optoelectronic component, emitted radiation is coupled out depending on the desired application. In this case, it may be relevant whether scattered light is emitted from the optoelectronic component or whether the radiation is intended to be oriented in one direction. In many applications it is important for the radiation to be emitted in a manner focused as much as possible in one direction. This is important in the case of emitters, for example, such as an automobile headlight or a flashlight. In the case, moreover, where the emitted radiation is coupled into an optical waveguide, accurate focusing of the radiation is desirable in order to avoid losses as a result of scattering or absorption.

SUMMARY OF THE INVENTION

One object of the present invention is to provide an optoelectronic component and a method for producing an optoelectronic component in which a well demarcated light cone can be emitted from a coupling-out area of the optoelectronic component, such that an emission is effected in a preferred main direction.

Various embodiments of the optoelectronic component comprise an optoelectronic semiconductor chip having a contact side and a radiation coupling-out side situated opposite the contact side. The optoelectronic component has a chip carrier, to which the semiconductor chip is applied via its contact side. A radiation conversion element is applied on the radiation coupling-out side of the semiconductor chip. Moreover, a potting compound is applied on the chip carrier, said potting compound laterally enclosing the semiconductor chip and the radiation conversion element. The potting compound is a reflective potting compound. It adjoins an upper edge of the radiation conversion element in a substantially flush fashion, such that a top side of the radiation conversion element is free of the potting compound.

Both the semiconductor chip and the radiation conversion element are laterally completely surrounded by the reflective potting compound. Light can thus leave the semiconductor chip only via the top side of the radiation conversion element. Otherwise, both the semiconductor chip and the radiation conversion element are laterally enclosed by the potting compound, while the chip carrier is provided toward the bottom, such that scattered light is reflected from the chip carrier and the potting compound back in the semiconductor chip or in the radiation conversion element, where it can then be coupled out via the top side of the radiation conversion element. A direction of the coupling-out of radiation which runs perpendicular to the top side of the radiation conversion element is thus substantially predefined. Scattered radiation is brought back into the radiation conversion element, and can be coupled out via the top side, such that overall a high efficiency of the optoelectronic component is obtained.

By virtue of the fact that the semiconductor chip and the radiation conversion element are laterally enclosed by the potting compound, it is moreover not necessary to provide a further housing. The semiconductor chip and also a connecting element provided on the contact side, such as an adhesive or soldering material, for example, are already sufficiently protected against environmental influences, in particular against contact with the atmosphere or with air humidity, by the potting compound.

A further advantage is afforded by the flush termination between the top side of the radiation conversion element and the potting compound. The optoelectronic component can easily be coupled to optical elements, such as an optical waveguide, for example, since it has a completely plane surface toward the top. Overall, an optoelectronic component is provided which has a well demarcated transition between a coupling-out area in the form of the top side of the radiation conversion element and a reflective bordering region in the form of the potting compound, such that a well demarcated light cone is emitted from a coupling-out area of the optoelectronic component during operation. A coupling-in area of an optical waveguide can be brought spatially very near to the luminous area of the optoelectronic component.

To put it another way, the reflective potting compound provides a lateral reflector enclosing not only the semiconductor chip but also the radiation conversion element. As a result of the complete lateral coverage, radiation is coupled out from the optoelectronic component at a limited solid angle in the direction of the normal to the surface of the radiation conversion element. Losses as a result of scattering in a lateral direction or as a result of absorption, for example at the chip carrier, are largely avoided.

In various embodiments, the semiconductor chip is electrically contact-connected via the chip carrier. In this case, the semiconductor chip, for example in the form of a flip-chip, can have both p-type and n-type contacts on its contact side. Both contacts can thus be directly connected to the chip carrier. An optoelectronic component is thus preferably provided which has no contacts on the radiation coupling-out side, such that no shading as a result of contact elements or electrical connections is present.

In various embodiments, the semiconductor chip is electrically contact-connected via its radiation coupling-out side; this is the case, for example, for a light-emitting diode that provides at least one contact, for example the n-type contact, on the radiation coupling-out side.

In various embodiments, the electrical contact on the radiation coupling-out side is electrically contact-connected to the chip carrier via a conductor connection, such that after the optoelectronic component has been housed, the connection contacts are situated only at the chip carrier.

In various embodiments, the conductor connection is embedded in the potting compound, such that it is no longer necessary to provide a further housing or protective element in order to protect the conductor connection against corrosion, for example.

In various embodiments, the conductor connection has a bonding wire. It is thus possible to have recourse to a contact-making method that is already known in association with optoelectronic components.

In various embodiments, a vertical extent of the bonding wire above the radiation coupling-out side is less than a height of the radiation conversion element above the radiation coupling-out side. The bonding wire is thus always covered by the potting compound, since the latter adjoins the upper edge of the radiation conversion element in a flush fashion. The provision of a further housing for protecting the bonding wire is obviated in this case, too. Moreover, a component height of the optoelectronic component is kept small in this way. It is determined only by the heights of the chip carrier, of the semiconductor chip and of the radiation conversion element. A significant miniaturization of the optoelectronic component is obtained, without the need to have recourse to special techniques such as through-plating, for example.

In various embodiments, the vertical extent of the bonding wire above the radiation coupling-out side is of the order of magnitude of 20 to 200 µm, for example 40 µm.

In various embodiments, the potting compound comprises a matrix material such as, for example, silicone or an epoxy resin. In this case, the use of silicone is particularly advantageous since silicone can be processed easily and is not destroyed by the radiation emitted by the semiconductor chip.

In various embodiments, the potting compound comprises dispersed scattering particles, which have the effect that the potting compound is a reflective potting compound. By way of example, the scattering particles comprise titanium dioxide. Other scattering particles, for example scattering particles containing aluminum oxide, are also conceivable.

In various embodiments, an optical element, for example a lens or an optical waveguide, is provided on the radiation conversion element. Said optical element can be applied and fixed to the plane surface of the optoelectronic component very easily.

In various embodiments of the method for producing an optoelectronic component, the potting compound is introduced by injection. In this case, the potting compound can be introduced by depression molding, for example. This can be done, in particular, by the potting compound being introduced through an opening provided in the chip carrier.

BRIEF DESCRIPTION OF THE DRAWINGS

Various exemplary embodiments of the optoelectronic component and of the method for producing such an optoelectronic component are explained in greater detail below with reference to the drawings. In the figures, the first digit(s) of a reference sign indicate(s) the figure in which the reference sign is first used. Identical reference signs are used for identical or identically acting elements or properties in all of the figures.

In the figures.

EXEMPLARY EMBODIMENTS OF AN OPTOELECTRONIC COMPONENT

Figure 1:
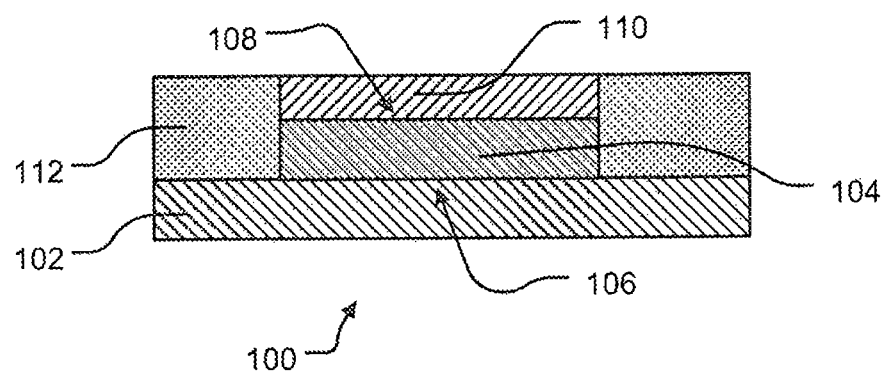
FIG. 1 shows a schematic cross-sectional illustration through a first exemplary embodiment of an optoelectronic component.

FIG. 1 shows a schematic cross-sectional illustration through a first exemplary embodiment of an optoelectronic component. The optoelectronic component 100 comprises a chip carrier 102. In this case, the chip carrier can be a ceramic carrier or a semiconductor carrier, on which an optoelectronic semiconductor chip 104 is applied. The optoelectronic semiconductor chip 104 is a light-emitting diode or some other optoelectronic element which emits or absorbs radiation. The optoelectronic semiconductor chip 104 may have been produced by a thin-film method, for example. It has a contact side 106, by which it is applied on the chip carrier 102 and via which it has at least one electronic contact. In this case, it is conceivable for a further electronic contact also to be connected to the chip carrier via the contact side.

On the side situated opposite the contact side 106, the optoelectronic semiconductor chip 104 has a radiation coupling-out side 108. Radiation generated in the optoelectronic semiconductor chip 104 is coupled out via the radiation coupling-out side 108. In order to achieve as efficient coupling-out of the generated radiation as possible, the chip carrier 102 can have, for example, a reflective surface in the region of the contact side 106.

A radiation conversion element 110 is applied on the radiation coupling-out side 108. The radiation conversion element 110 very generally comprises a phosphorescent material in which radiation emitted by the optoelectronic semiconductor chip 104 is at least partly absorbed. The radiation excites a phosphorescent transition in the radiation conversion element 110. As the result, a second radiation is emitted by the radiation conversion element 110, the wavelength of said second radiation differing from the radiation from the optoelectronic semiconductor chip 104. In this way, the optoelectronic component 100 can emit radiation over a wide frequency spectrum.

A potting compound 112 is applied on the chip carrier 102, said potting compound laterally completely enclosing the optoelectronic semiconductor chip 104 and the radiation conversion element 110. In this case, the potting compound 112 extends as far as an upper edge of the radiation conversion element 110, that is to say that it terminates flush with the upper edge. The potting compound 112 typically comprises a matrix material, for example silicone or else an epoxy resin. Scattering particles are dispersed in the matrix material. The scattering particles are typically titanium dioxide particles or aluminum oxide particles. Since the optoelectronic semiconductor chip 104 and the radiation conversion element 110 are laterally enclosed by the potting compound 112, scattered radiation emitted laterally by the semiconductor chip 104 or the radiation conversion element 110 is reflected back again and ideally it reaches the radiation conversion element 110 again, from which it can be coupled out via the top side. In this way, radiation is coupled out only via the top side of the radiation conversion element 110 and is sharply focused in this respect, that is to say that a well demarcated transition between the coupling-out area represented by the top side of the radiation conversion element 110 and the bordering region of the potting compound 112 is obtained, such that a well demarcated light cone can be emitted from a coupling-out area of the optoelectronic component.

Since the potting compound 112 adjoins the top side of the radiation conversion element 110 in a flush fashion, the optoelectronic component 100 has a particularly plane surface. In addition, the optoelectronic semiconductor chip 104 is completely enclosed by the radiation conversion element 110, the chip carrier 112 and the potting compound 112, and so there is no need to provide a further housing for protecting the optoelectronic semiconductor chip 104. Overall, an optoelectronic component can thus be produced in a simple manner. It is suitable for further use without the need to take a special precaution for shaping a coupling-out of radiation from the electronic semiconductor chip 104 or for providing a special housing for protecting the optoelectronic semiconductor chip 104.

Figure 2:
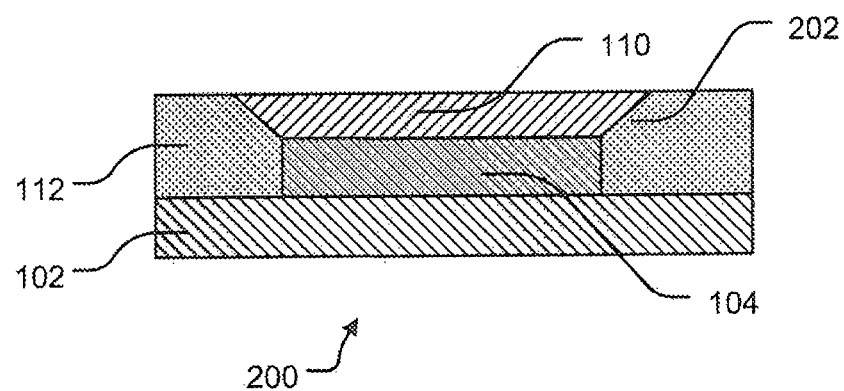
FIG. 2 shows a schematic cross-sectional illustration through a second exemplary embodiment of an optoelectronic component.

FIG. 2 shows a schematic illustration of a cross section through a second exemplary embodiment of an optoelectronic component. In this case, the optoelectronic component 200 differs from the optoelectronic component 100 of the first exemplary embodiment in that the radiation conversion element 110 has a special shape. In this case, a stop edge 202 is provided at the radiation conversion element 110, and serves to produce, during the production of the optoelectronic component 200, a boundary for a lateral wetting during potting with the potting compound 112, such that the potting compound 112 adjoins the top side of the radiation conversion element 110 in a flush fashion.

In the second exemplary embodiment shown, the radiation conversion element 110 has a cone-like shape, i.e. a shape like a truncated pyramid, such that the stop edge 202 runs away from the surface of the optoelectronic semiconductor chip 104 and can fulfill the function of a reflector in addition to the function as a wetting boundary. In this case, as illustrated in the drawing, the course of the stop edge 202 can proceed linearly. It is likewise conceivable for other courses of the stop edge 202 to be present, for example courses that proceed concavely or convexly.

The optoelectronic component 200 exhibits the property, in particular, that, by virtue of the shape of the stop edge 202, a radiation path of the coupled-out radiation is focused and runs in the direction of the normal to the surface of the radiation conversion element 110.

Figure 3:
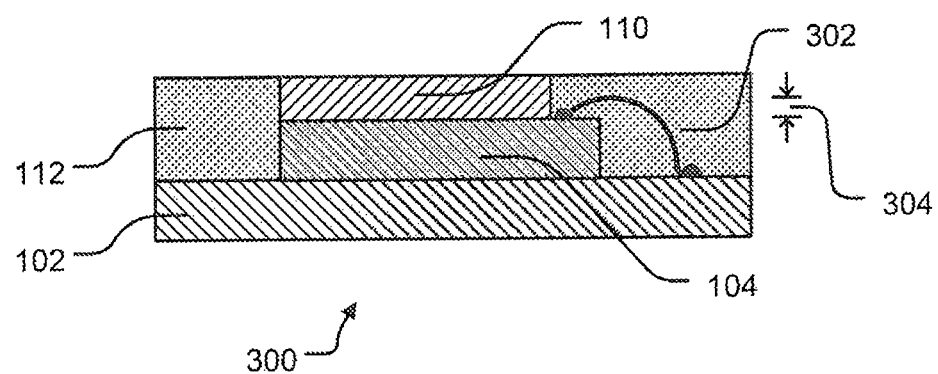
FIG. 3 shows a schematic cross-sectional illustration through a third exemplary embodiment of an optoelectronic component.

FIG. 3 shows the schematic illustration of a cross section through a third exemplary embodiment of an optoelectronic component. The optoelectronic component 300 differs from the optoelectronic component 100 of the first exemplary embodiment in that a conductor connection 302 is provided, which produces a contact connection via the radiation coupling-out side 108 to the chip carrier 102. In this case, the conductor connection 302 is a bonding wire, in particular, the vertical extent 304 of which does not rise higher than the height of the radiation conversion element above the radiation coupling-out side 108. This ensures that the conductor connection 302 is completely enclosed by the potting compound 112. A typical size of the vertical extent 304 is of the order of magnitude of 20 to 200 µm, for example 40 µm.

Figure 4:
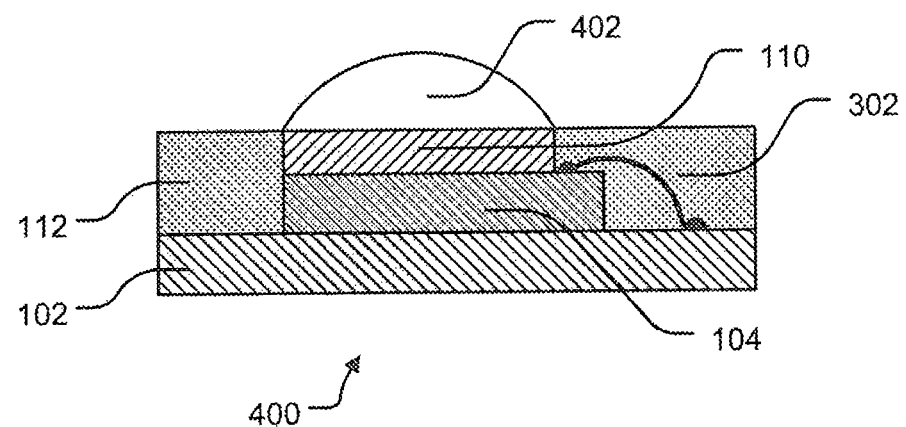
FIG. 4 shows a schematic cross-sectional illustration through a fourth exemplary embodiment of an optoelectronic component.

FIG. 4 shows the schematic illustration of a cross section through a fourth exemplary embodiment of an optoelectronic component, wherein the optoelectronic component 400 differs from the optoelectronic component 300 of the third exemplary embodiment in that an optical element 402 in the form of a lens is applied above the radiation conversion element, i.e. directly on the top side thereof. A further beam shape of the coupled-out radiation can thus be effected. The optical element 402, as illustrated in FIG. 4, can be a lens. It is likewise conceivable for the optical element to be an optical waveguide, such that the radiation generated in the optoelectronic semiconductor chip 104 is introduced completely into the optical waveguide.

Exemplary Embodiments of a Method for Producing an Optoelectronic Component

Figure 5A:
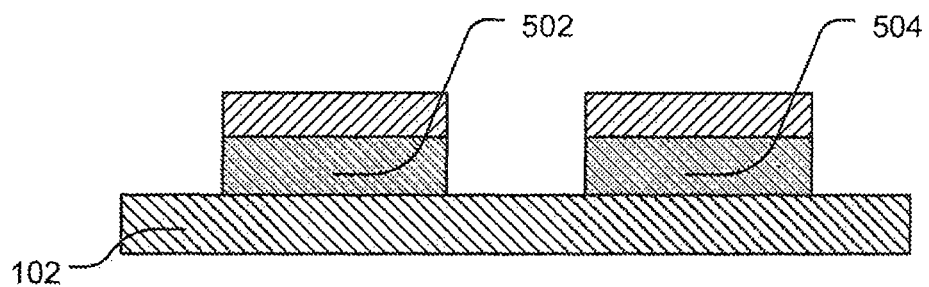
FIGS. 5a and 5b show a schematic illustration of a first exemplary embodiment of a method for producing an optoelectronic component.
Figure 5B:
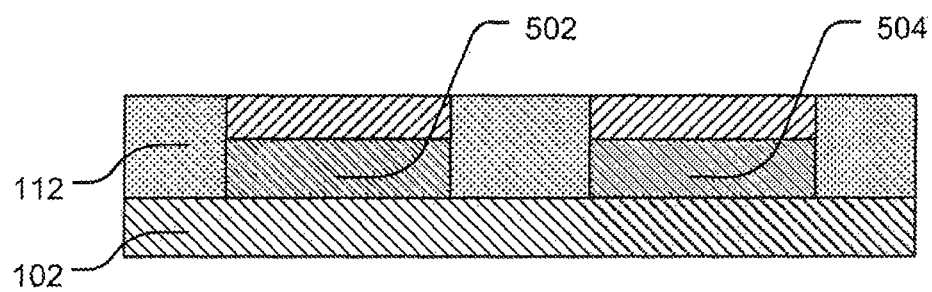

FIG. 5a and FIG. 5b show a schematic illustration of a first exemplary embodiment of a method for producing an optoelectronic component. In this case, as illustrated in FIG. 5a, firstly a chip carrier 102 is provided, on which a first optoelectronic semiconductor chip 502 and a second optoelectronic semiconductor chip 504 have already been applied. The first optoelectronic semiconductor chip 502 and the second optoelectronic semiconductor chip 504 can be fixed onto the chip carrier 102 by die attachment or by wafer level bonding, for example. A radiation conversion element is in each case applied on the first optoelectronic semiconductor chip 502 and the second optoelectronic semiconductor chip 504. These radiation conversion elements ideally have a stop edge, as described with respect to FIG. 2. In order to simplify the illustration, an illustration of the stop edge has been omitted in FIG. 5a and in the subsequent FIG. 5b.

After the semiconductor chips have been provided on the chip carrier 102, the entire chip carrier 102 is filled with a potting compound 112, thus resulting in a matrix composed of semiconductor chips 502 and 504 and potting compound 112, as illustrated in FIG. 5b. This matrix can be used as a luminous module, for example for automobile headlights or flashlights or other applications; however, it is likewise conceivable for the optoelectronic semiconductor chips 502 and 504 to be singulated after the process of filling with the potting compound 112, such that individual optoelectronic components arise, as illustrated for example in FIG. 1 to FIG. 4.

This method is a particularly simple method. However, it must be ensured here that the potting compound 112 adjoins the top side of the radiation conversion elements in a flush fashion. This can be achieved particularly advantageously by means of the radiation conversion elements having a stop edge, as illustrated in FIG. 2.

Figure 6A:
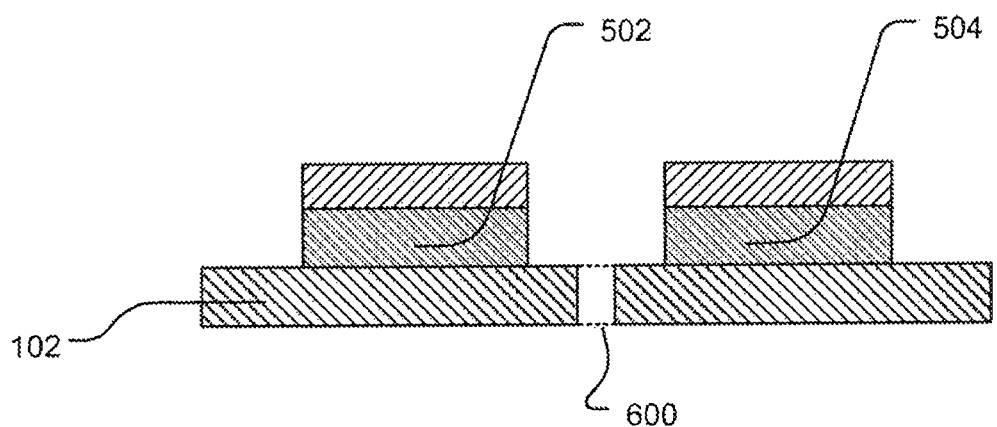
FIGS. 6a to 6d show a schematic illustration of a second exemplary embodiment of a method for producing an optoelectronic component.
Figure 6B:
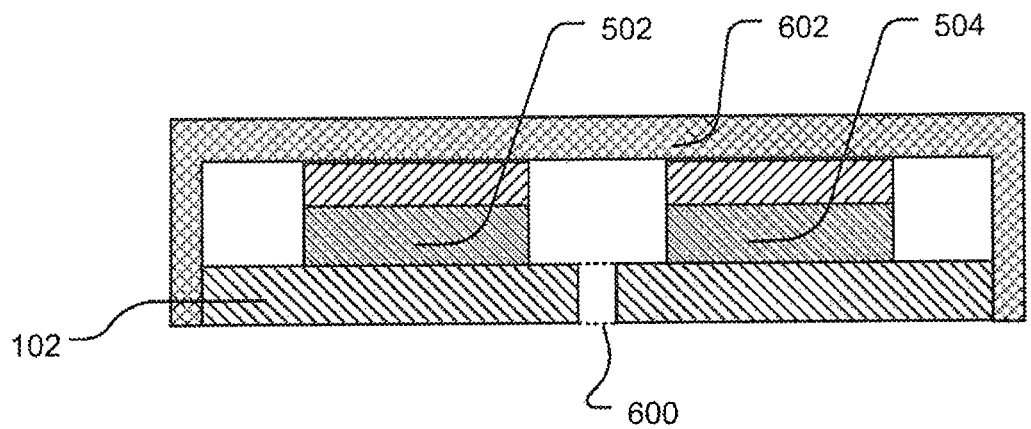

FIG. 6a to FIG. 6d show a schematic illustration of a second exemplary embodiment of a method for producing an optoelectronic component. This method makes use of so-called compression molding. For this purpose, as illustrated in FIG. 6a, a chip carrier 102 is provided, on which a first optoelectronic semiconductor chip 502 and a second optoelectronic semiconductor chip 504, in a manner analogous to that described in the method in the description concerning FIG. 5a, are applied. The chip carrier 102 has an opening 600 extending through the chip carrier 102.

Figure 6C:
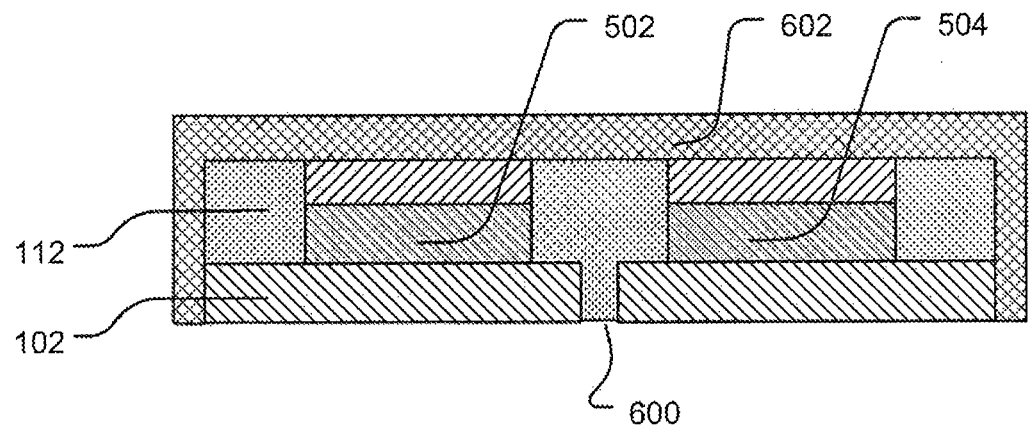

In a second method step, a compression mold 602 is applied over the semiconductor chips and the chip carrier 102. In this case, the chip carrier 102 is enclosed by the compression mold 602, such that an inner region can be reached only through the opening 600. In a further method step, as illustrated in FIG. 6c, the potting compound 112 is introduced via the opening 600. This is preferably done by introduction under pressure, wherein scattering particles, such as titanium dioxide, are dispersed in the potting compound 102.

Figure 6D:
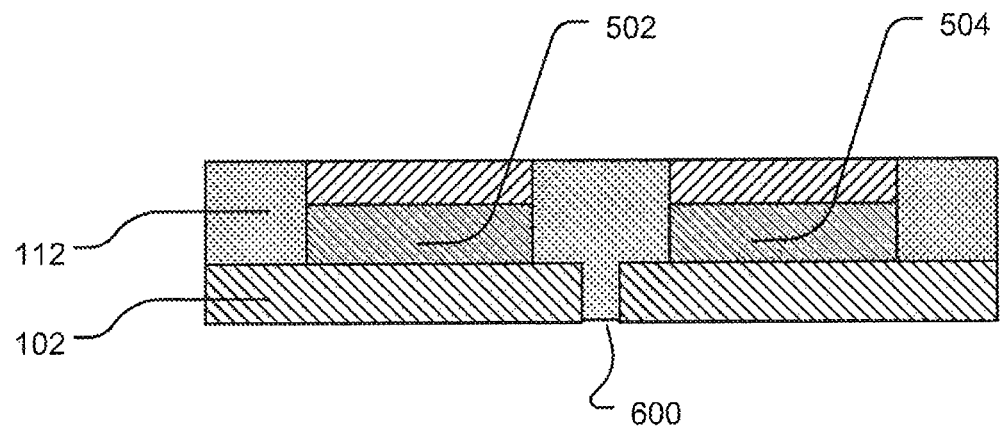

After curing of the potting compound, the compression mold 602 can be removed, such that a matrix module is subsequently provided, as illustrated in FIG. 6d. This matrix module is also suitable for use as a luminaire with a multiplicity of optoelectronic semiconductor chips, for example for an application as an automobile headlight or as a flashlight for mobile applications. However, it is likewise conceivable for singulation to be carried out, such that individual optoelectronic components, as illustrated in FIG. 1 to FIG. 4, are subsequently obtained.

It goes without saying here that the exemplary embodiments of the production methods can be modified in such a way that the second exemplary embodiment, the third exemplary embodiment or the fourth exemplary embodiment of the optoelectronic component can also be obtained.

Concluding Statement

The optoelectronic component and the method for producing an optoelectronic component have been described on the basis of some exemplary embodiments in order to illustrate the underlying concept. In this case, the exemplary embodiments are not restricted to specific combinations of features. Even if some features and configurations have been described only in connection with a particular exemplary embodiment or individual exemplary embodiments, they can in each case be combined with other features from other exemplary embodiments. It is likewise possible to omit or add individual features presented or particular configurations in exemplary embodiments, insofar as the general technical teaching remains realized.

The invention claimed is:

1. A method for producing an optoelectronic component, comprising:
    applying an optoelectronic semiconductor chip, having a contact side and a radiation coupling-out side situated opposite the contact side, on a chip carrier, the optoelectronic semiconductor chip being applied to the chip carrier via its contact side;
    applying a radiation conversion element on the radiation coupling-out side of the optoelectronic semiconductor chip, the radiation conversion element having a shape that widens from the radiation coupling-out side to the top side of the radiation conversion element so as to form a stopping edge at the radiation conversion element; and
    applying a reflective potting compound on the chip carrier so as to laterally enclose and contact both the semiconductor chip and the radiation conversion element such that a top side of the radiation conversion element is free of the potting compound,
    wherein the stopping edge forms a boundary for a lateral wetting during application of the potting compound such that the potting compound adjoins the top side of the radiation conversion element in a flush fashion.

2. The method as claimed in claim 1, wherein the semiconductor chip is electrically contact-connected via the chip carrier.

3. The method as claimed in claim 1, wherein the semiconductor chip is electrically contact-connected via its radiation coupling-out side.

4. The method as claimed in claim 3, wherein the radiation coupling-out side is electrically contact-connected to the chip carrier via a conductor connection.

5. The method as claimed in claim 4, wherein the conductor connection is embedded in the potting compound.

6. The method as claimed in claim 4, wherein the conductor connection has a bonding wire.

7. method as claimed in claim 6, wherein a vertical extent of the bonding wire above the radiation coupling-out side is less than a height of the radiation conversion element above the radiation coupling-out side.

8. The method as claimed in claim 6, wherein a vertical extent of the bonding wire above the radiation coupling-out side is in the range of 20 to 200 μm.

9. The method as claimed in claim 1, wherein the potting compound comprises silicone.

10. The method as claimed in claim 1, wherein the potting compound comprises dispersed scattering particles.

11. method as claimed in claim 10, wherein the scattering particles comprise titanium dioxide.

12. The method as claimed in claim 1, further comprising applying an optical element on the radiation conversion element.

13. The method as claimed in claim 1, wherein the potting compound is introduced by injection.

14. The method as claimed in claim 13, wherein the potting compound is introduced by compression molding.

15. The method as claimed in claim 14, wherein the potting compound is introduced through an opening provided in the chip carrier.

16. The method as claimed in claim 6, wherein a vertical extent of the bonding wire above the radiation coupling-out side is 40 μm.

17. The method as claimed in claim 12, wherein said optical element is a lens.

* * * * *